United States Patent [19]

Tanaka et al.

[11] Patent Number: 4,692,902
[45] Date of Patent: Sep. 8, 1987

[54] SEMICONDUCTOR READ ONLY MEMORY DEVICE WITH IMPROVED ACCESS TIME

[75] Inventors: Sumio Tanaka, Tokyo; Shinji Saito, Yokohama; Shigeru Atsumi, Tokyo, all of Japan

[73] Assignee: Kabushiki Kaisha Toshiba, Kawasaki, Japan

[21] Appl. No.: 654,215

[22] Filed: Sep. 25, 1984

[30] Foreign Application Priority Data

Sep. 26, 1983 [JP] Japan .................................. 58-177584

[51] Int. Cl.⁴ .............................................. G11C 7/00
[52] U.S. Cl. ..................................... 365/210; 365/205
[58] Field of Search ............... 365/189, 205, 208, 210, 365/190

[56] References Cited

U.S. PATENT DOCUMENTS

| | | | |
|---|---|---|---|
| 4,090,257 | 5/1978 | Williams | 365/184 |
| 4,223,394 | 9/1980 | Pathak et al. | 365/210 |
| 4,249,095 | 2/1981 | Hsu | 307/350 |
| 4,494,219 | 1/1985 | Tanaka et al. | 365/189 |

FOREIGN PATENT DOCUMENTS 51-94729 8/1976 Japan .

OTHER PUBLICATIONS

Wilson, et al., "A 100ns 150mW 64Kbit ROM", IEEE International Solid—State Circuits Conf., Feb. 1978, Digest of Technical Papers, IEEE, New York, pp. 152, 153, 273.

Primary Examiner—James W. Moffitt
Attorney, Agent, or Firm—Schwartz, Jeffery, Schwaab, Mack, Blumenthal & Evans

[57] ABSTRACT

A semiconductor memory device in which the differential amplifier circuit compares a potential of a bit line to which memory cells storing information are connected with a reference potential of a dummy line to which a dummy cell is connected, and detects information stored in each of the memory cells. The semiconductor memory device comprises a circuit which discharges both the bit line and the dummy line to a low potential when the chip enable inverted signal is supplied. When the chip enable signal is supplied, therefore, the differential amplifier circuit can detect a difference between the bit line potential and the dummy line potential before the bit line is fully charged up. This makes it possible to produce the chip enable access time and to realize higher speed operations.

11 Claims, 5 Drawing Figures

SEMICONDUCTOR READ ONLY MEMORY DEVICE WITH IMPROVED ACCESS TIME

BACKGROUND OF THE INVENTION

The invention relates generally to semiconductor memory devices, and more particularly to EPROMs, EEPROMs, mask ROMs, and other read-only semiconductor memory devices.

In semiconductor memory devices, memory cells storing information are generally connected to a bit line. The potential of this bit line changes depending on information stored in a selected memory cell. The bit line potential thus determined is compared with a reference potential by a differential amplifier. By setting the reference potential beforehand at the mean value of the changing potential of the bit line, the differential amplifier detects, upon comparison, information stored in the selected memory cell.

When a memory chip is not selected, the bit line is discharged to the low level, preventing itself from falling into a floating condition. Therefore, the chip enable access time $t_{CE}$, which is the time from the time point at which a chip enable signal CE reaches a high level to the time mpoint at which the data is outputted, includes a re-charging time of the bit line, which has discharged to the low level. The access time of the chip itself is the chip enable access time $t_{CE}$ or the address access time $t_{ACC}$, whichever is longer. The address buffer circuit, however, is controlled by the chip enable signal CE, so that, in conventional memory devices, the chip enable access time $t_{CE}$ is longer than the address access time $t_{ACC}$ by a delay due to the chip enable buffer circuit.

SUMMARY OF THE INVENTION

The object of this invention is to provide a semiconductor memory device having a shorter chip enable access time. This object is achieved by maintaining both the bit line potential and the reference potential, which is another input of the differential amplifier, at a low level, when the chip is not selected.

DETAILED DESCRIPTION OF THE INVENTION

Figure 1:
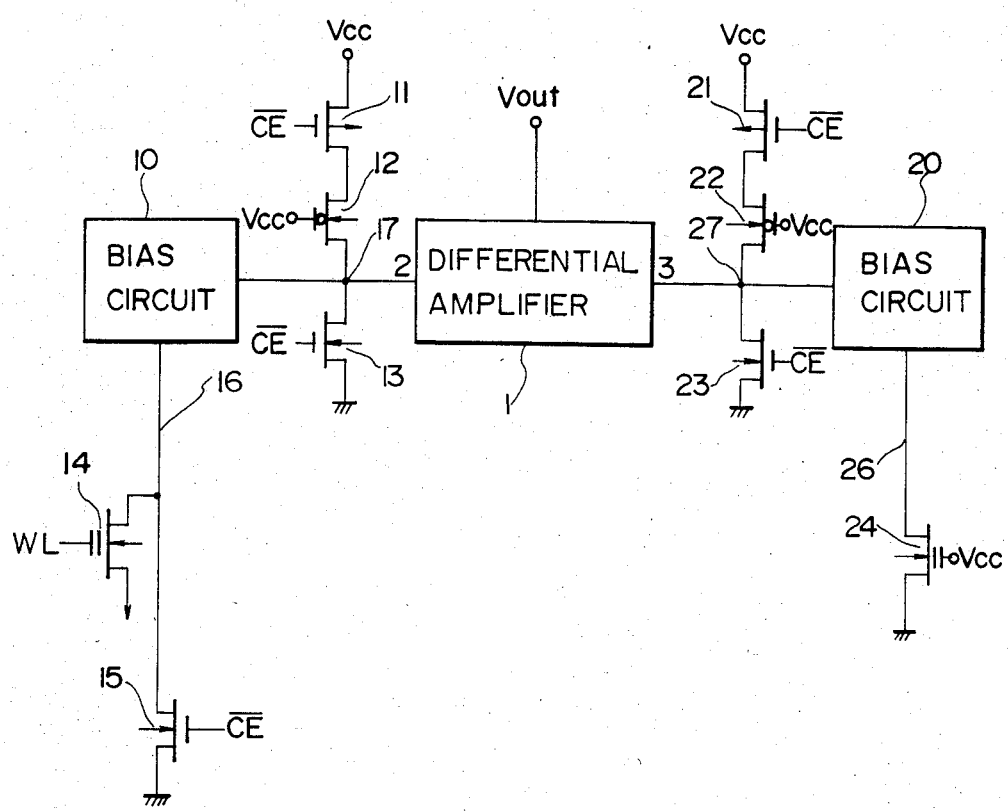
FIG. 1 is a circuit diagram of a part of a semiconductor memory device according to one embodiment of the present invention.
Figure 2:
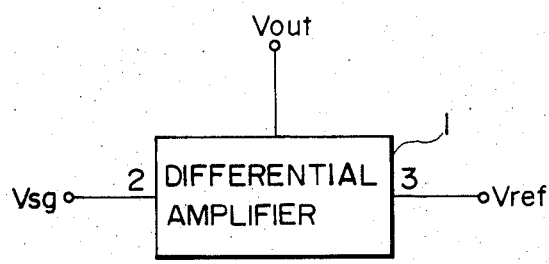
FIG. 2 is a diagram illustrating a differential amplifier of the one embodiment.

FIGS. 1 and 2 show a semiconductor memory device, an EPROM composed of CMOSs, according to one embodiment of the invention. As seen from FIGS. 1 and 2, a differential amplifier 1 has two input terminals 2 and 3. The signal of a bit line 16 is controlled by a bias circuit 10 and is fed as input potential to the input terminal 2. The potential of this signal Vsg is compared with a reference potential Vref, fed as input to the input terminal 3.

On the side of the input terminal 2, a p-channel FET 11, an intrinsic n-channel FET 12, and an n-channel FET 13 are connected ins eries, i.e., the FETs 12 and 13 are connected at a connection point 17 on the line connected to the input terminal 2. The gates of both p-channel FET 11 and n-channel FET 13 are supplied as input with the inverted signal $\overline{CE}$ of the chip enable signal CE (hereinafter called a chip enable inverted signal $\overline{CE}$), and the gate of the intrinsic n-channel FET 12 is supplied with power voltage Vcc. The source of the p-channel FET 11 is connected to the power supply Vcc, and the source of the n-channel FET 13 is grounded. The connection point 17 is connected to the bit line 16 via the bias circuit 10. Connected to the bit line 16 are a memory cell 14 and an n-channel FET 15. The memory cell 14 comprises an n-channel FET having a floating gate, and the gate of the n-channel FET 15 is supplied as input with the chip enable inverted signal $\overline{CE}$. The bias circuit 10 changes the potential of the bit line 16 to a level appropriate as a signal voltage of the differential amplifier 1.

On the side of the input terminal 3 also, a p-channel FET 21, an intrinsic n-channel FET 22, and an n-channel FET 23 are connected in series, i.e., the FETs 22 and 23 are connected at a connection point 27 on the line leading to the input terminal 3 of the differential amplifier 1. Like the side of the input terminal 2 for signal potentials, the gates of both p-channel FET 21 and n-channel FET 23 are supplied as input with the chip enable inverted signal $\overline{CE}$. And the gate of the intrinsic n-channel FET 22 is supplied with the power voltage Vcc. The source of the p-channel FET 21 is supplied with the power voltage Vcc, and the source of n-channel FET 23 is grounded. The connection point 27 is connected to a dumy line 26 via a bias circuit 20. Connected to this dummy line 26 is a dummy cell 24 that comprises an n-channel FET having a floating gate. This floating gate is charged to an intermediate logical level. The source of the n-channel FET 24 is grounded and the gate is supplied with the power voltage VCC, maintaining the FET 24 always selected. The bias circuit 20 changes the potential of the dummy line 26 to an appropriate reference potential.

The operation of the semiconductor memory device of the present embodiment is described below. When the chip enable inverted signal $\overline{CE}$ goes low to select the ship, the FETs 11 and 21 are turned ON and the FETs 13, 23 and 15 are turned OFF. The potential of the bit line 16 differs depending on whether or not electric charge are accumulated on the floating gate of the memory cell 14. The potential of the connection point 17 accordingly changes. It assumes, for example, either 4.5 V or 3.0 V. Therefore, if the potential of the connection point 27 has been set at an intermediate level, for example, 3.6 V by accumulating electric charge in the floating gate of the dummy cell 24, the differential amplifier 1 can detect information stored in the memory cell 14 by comparing the two potentials given at its input terminals 2 and 3 with each othe.

When, on the other hand, the chip enable inverted signal $\overline{CE}$ changes from a low level to a high level and the chip is in non-selected condition, the p-channel FET 11 is turned OFF and the n-channel FETs 13 and 15 are turned ON, discharging the bit line 16 to the low level. The reason that the bit line 16 is to be discharged to the low level when the chip is not selected is to prevent the bit line 16 from falling in an unstable floating state due to the OFF state of the FET 11. In addition, in this embodiment, the connection point 27 is connected to the n-channel FET 23, so that it is also discharged to a low level when the chip is not selected. More specifically, when the chip enable inverted signal $\overline{CE}$ changes from the low level to the high level, the p-channel FET 21 is turned OFF and the n-channel FET 23 ON, thus discharging the connection point 27 to the low level.

When the chip enable inverted signal $\overline{CE}$ is changed again from the high level to the low level to select the chip, the p-channel FETs 11 and 21 are turned ON, charging up the bit line 16. In this embodiment, however, the differential amplifier 1 can detect information stored in the memory cell 14 before the bit line 15 becomes fully charged. That is, since not only the bit line 16 and the connection point 17 but also the connection point 27 on the reference potential side has been discharged to the low level, the potentials of both connection points 17 and 27 rise at nearly the same speed. At the same time, the potential of the bit line 16 also changes with information stored in the memory cell 14, affecting in turn the potential of the connection point 17 via the bias circuit 10. Therefore, before both the signal voltage at the connection point 17 and the reference voltage at the connection point 27 reach their respective final potentials, a certain potential difference can be established between them, which is always sufficient for detection by the differential amplifier 1. In such a way, unlike the prior art access method, the present invention enables access to information stored in the memory cell before the bit line 16 is fully charged, making the chip enable access time $t_{CE}$ shorter than the corresponding address access time $t_{ACC}$. This makes it possible to reduce the access time of the chip.

Figure 3:
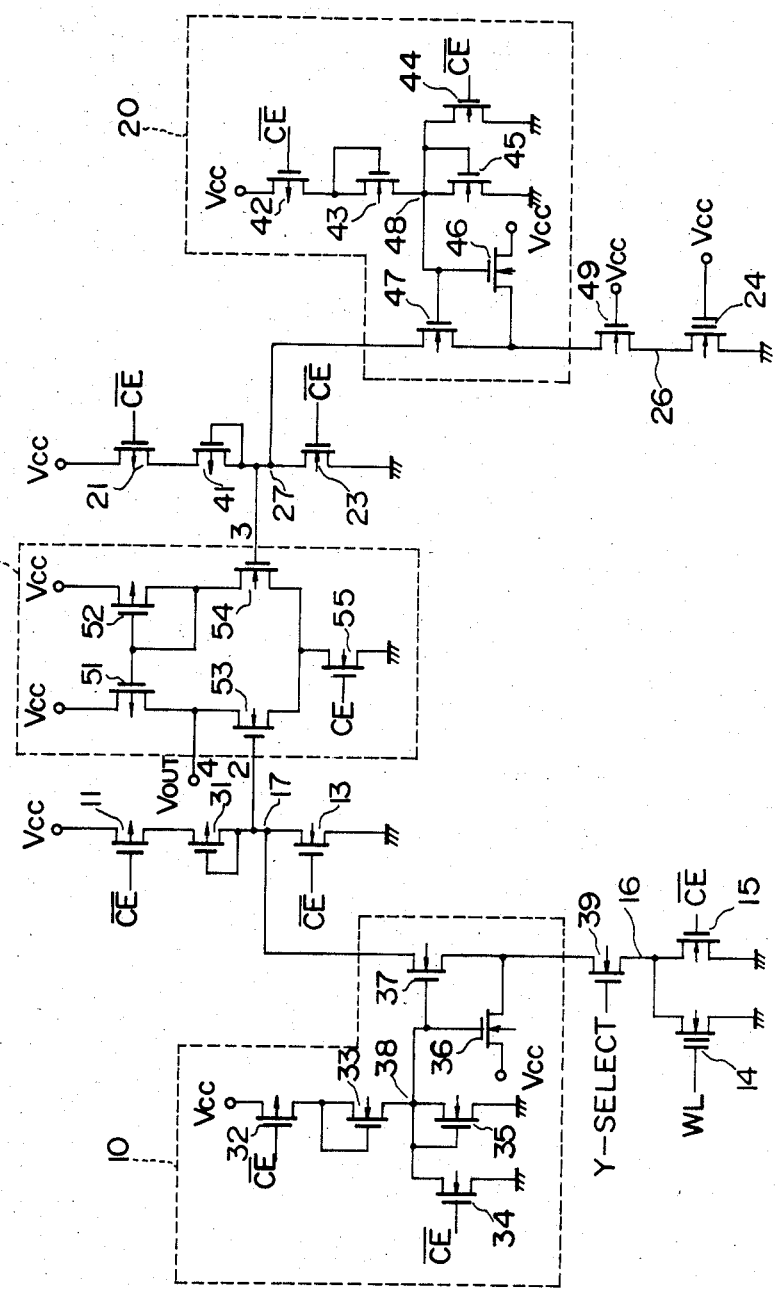
FIG. 3 is a circuit diagram of a part of a semiconductor memory device according to another embodiment of the present invention.

FIG. 3 shows a semiconductor memory device according to another embodiment of the invention. The semiconductor memory device is an EPROM constructed of CMOS circuits. In FIG. 3, the differential amplifier 1 is composed of 5 FETs: a pair of n-channel FETs 53 and 54, a current-mirrored pair of p-channel FETs 51 and 52 to serve as loads of FETs 53 and 54 respectively, and an n-channel FET 55 to serve as a constant current-source. The input terminals 2 and 3 are connected to the gates of the FETs 53 and 54, respectively, an output terminal 4 to the drain of the FET 53, and the sources of the FETs 53 and 54 to the drain of the FET 55, which serves as a constant current-source. The drains of the FETs 53 and 54 are connected to the drains of the FETs 51 and 52, respectively, and the gates of both FETs 51 and 52 to the drain of the FET 54, feeding the drain potential of the FET 54 back to the gates of both FETs 51 and 52. The sources of both FETs 51 and 52 are supplied as input with the power voltage Vcc. A difference between potentials applied at the gates of the FETs 53 and 54 is amplified by the differential amplifier 1 and fed to the output terminal 4.

On the side of the input terminal 2, p-channel FETs 11 and 31 and an n-channel FET 13 are connected in series. The FETs 31 and 13 are connected at the connection point 17 on the line leading to an input terminal 2 of the differential amplifier 1. The gates of both p-channel FET 11 and n-channel FET 13 are supplied as input with the chip enable inverted signal $\overline{CE}$, and the gate and the drain of the p-channel FET 31 are connected to each other. The source of the p-channel FET 11 is supplied with the power voltage Vcc, and the source of the n-channel FET 13 is grounded. The connection point 17 is connected to the bit line 16 via the bias circuit 10 and an n-channel FET 39. The bit line 16 is connected to a memory cell 14 that is composed of an n-channel FET having a floating gate and also an n-channel FET 15, whose gate is supplied as input with the chip enable inverted signal $\overline{CE}$.

The bias circuit 10 changes the amplitude of potential variations of the bit line 16 to a level appropriate for signal input to the differential amplifier 1. The connection point 17 is connected with the drain of an n-channel FET 37, whose source is connected to the source of an n-channel FET 36. The drain of the FET 36 is supplied with the power voltage Vcc. The gates of both FETs 36 and 37 are connected to a connection point 38 and a p-channel FET 32 and n-channel FETs 33 and 35 are connected in series and inserted between the power voltage Vcc and the ground. The source of the FET 32 is supplied with the power voltage VCC and the gate is supplied with the chip enable inverted signal $\overline{CE}$. The gates of both FETs 33 and 35 are connected to their own drains, respectively, and the source of the FET 33 and the drain of the FET 35 to the connection point 38. A connection point 38 is also connected to the drain of n-channel FET 34, whose source is grounded and whose gate is supplied as input with the chip enable inverted signal $\overline{CE}$.

On the side of the input terminal 3, on the other hand, p-channel FETs 21 and 41 and an n-channel FET 23 are connected in series, and FETs 41 and 23 are connected to a connection point 27 on the line connected to another input terminal 3 of the differential amplifier 1. The gates of the p-channel FET 21 and the n-channel FET 23 are both supplied as input with the chip enable inverted signal $\overline{CE}$, and the gate and the drain of the p-channel FET 41 are connected to each other. The source of the p-channel FET 21 is supplies with the power voltage Vcc, and the source of the n-channel FET 23 is grounded. The connection point 27 is connected to a dummy line 26 via the bias circuit 20 and an n-channel FET 49. This dummy line 26 is connected with a dummy cell 24 that is composed of a n-channel FET having a floating gate. This floating gate is charged up to an intermediate logical level. The source of the n-channel FET 24 is grounded and the gate is supplied as input with the power voltage Vcc, maintaining the FET 24 itself always selected.

The bias circuit 20 changes the potential of the dummy line 26 to a level appropriate for reference potential to be fed as input to the differential amplifier 1. The connection point 27 is connected to the drain of an n-channel FET 47, whose source is connected to the source of an n-channel FET 46. The drain of the FET 46 is supplied with the power voltage Vcc. The gates of both FETs 46 and 47 are both connected to a connection point 48. A p-channel FET 42 and n-channel FETs 43 and 45 are connected in series and inserted between the power supply Vcc and the ground. The source of the FET 42 is supplied with the power voltage Vcc and also the gate is supplied with the chip enable inverted signal $\overline{CE}$. The gates and the drains of both FETs 43 and 45 are connected to each other, respectively. The source of the FET 43 and the drain of the FET 45 are connected to the connection point 48, which is also connected to the drain of an n-channel FET 44. The source of the FET 44 is grounded and the gate is supplied as input with the chip enable inverted signal $\overline{CE}$.

The basic operations of this embodiment are nearly the same as those of the first embodiment shown in FIG.

1. But the bias circuits 10 and 20 in this embodiment are features by speedy charging of the bit line 16 and the dummy line 26, respectively. When the chip is selected, the FETs 32 and 42 are turned ON and the FETs 34 and 44 turned OFF. The gates of the FETs 37 and 47 are supplied as input with potentials dependent on the combination of the FETs 33 and 35 and the combination of the FETs 43 and 45 respectively, and both FETs 37, 47 are turned ON. When the chip is not selected, FETs 32 and 42 are turned OFF and FETs 34 and 44 are turned ON. Therefore, the gates of the FETs 37 and 47 are supplied with the ground potential, and both FETs 37, 47 are turned OFF. Moreover, the differential amplifier 1 of this embodiment is featured by highly sensitive amplifications by the use of a current-mirrored pair of p-channel FETs 51 and 52.

This invention can be adapted to mask ROMs, EEPROMs, and other read-only semiconductors memory devices, besides EPROMs of CMOS circuits used in the above embodiments of this invention.

As abovementioned, this invention can reduce the chip enable access time, and provide high-speed semiconductor memory devices. This invention especially is featured by a reduction of the chip enable access time by the use of the characteristics of differential amplifier circuit of a very simple construction, and without changing the basic configuration of the conventional semiconductor memory device.

Figure 4:
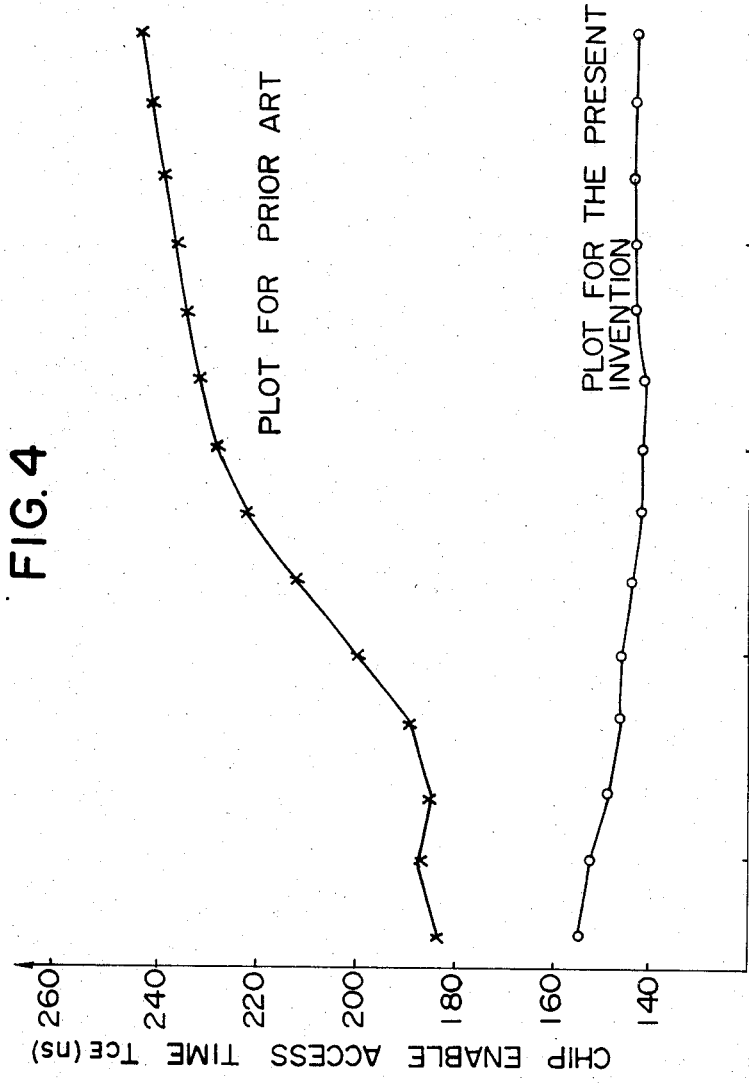
FIG. 4 is a graph showing measurements of the chip enable access time of the semiconductor memory device according to the invention.
Figure 5:
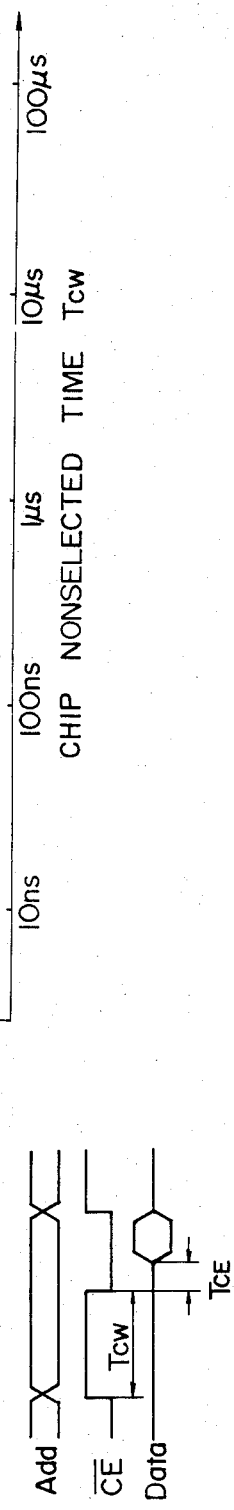
FIG. 5 is a timing diagram for the measurement method.

The chip enable access time measurements on semiconductor memory devices by the present invention are shown in FIG. 4. The chip enable access time $t_{CE}$, a time from chip selection to data output, was plotted against the time the chip is not selected, $t_{CW}$, as shown in FIG. 5. As can be seen from FIG. 4, unlike the case of prior art, the chip enable access time $t_{CE}$ of the present invention decreases remarkably as the time the chip is not selected, $t_{CW}$, increases.

What is claimed is:

1. A semiconductor memory device comprising:
   memory cells storing information;
   a bit line connected to said memory cells;
   static-type differential amplifier means havig a first input temrinal at which the potential of said bit line is fed as an input, a second input terminal at which a reference potential is fed as an input, and an output temrinal independent of said first and second input terminals, said differential amplifier means comparing potentials fed at said first and second input terminals with each other and detecting information stored in each of said memory cells;
   first means responsive to a chip enable inverted signal for discharging said bit line to a predetermined potential level; and
   second means responsive to said chip enable inverted signal for discharging said reference potential to substantially the same level as said predetermined potential level.

2. A semiconductor memory device as claimed in claim 1, in which said first means comprises an n-channel FET having a drain connected to said first input terminal of said differential amplifier means, a source grounded, and a gate supplied with the chip enable inverted signal and said second means comprises an n-channel FET having a drain connected to said second input terminal of said differential amplifier means, a source grounded, and a gate supplied with the chip enable inverted signal.

3. A semiconductor memory device as claimed in claim 2, in which said differential amplifier means further comprises:
   first and second n-channel FETs having gates connected to said first and second input terminals respectively and sources connected with each other;
   first and second p-channel FETs having drains connected to the drains of said first and second n-channel FETs respectively, gates both connected to the drain of said second n-channel FET, and sources both connected to a power supply; and
   an output terminal connected to the drain of said first n-channel FET.

4. A semiconductor memory device comprising:
   memory cells storing information;
   a bit line connected to said memory cells;
   a dummy cell storing dummy information;
   a dummy line connected to said dummy cell;
   static type differential amplifier means having a first input terminal at which said bit line is connected, a second input terminal at which said dummy line is connected, and an output terminal independent of said first and second input temrinals, said differential amplifier means comparing potentials fed at said first and second input terminals with each other and detecting information stored in each of said memory cells;
   first means responsive to a chip enable inverted signal for discharging said bit line to a predetermined potential elve; and
   second means responsive to said chip enable inverted signal for discharging said dummy line to substantially the same level as said predetermined potential.

5. A semiconductor memory device as claimed in claim 4, in which said first means comprisea an n-channel FET having a drain connected to said first input terminal of said differential amplifier means, a source grounded, and a gate supplied as inptu with the chip enable inverted signal and said second means comprises an n-channel FET having a drain connected to said second input terminal of said differential amplifier means, a source grounded, and a gate supplied as an iput with the chip enable inverted signal.

6. A semiconductor memory device as claimed in claim 5, in which said differential amplifier means further comprises:
   first and second n-channel FETs having gates connected to said first and second input terminals respectively and sources connected with each other;
   first and second p-channel FETs having drains connected to the drains of said first and second n-channel FETs respectively, gates both connected to the drain of said second n-channel FET, and sources both connected to a power supply; and
   an output terminal connected to the drain of said first n-channel FET.

7. A semiconductor memory device as claimed in claim 5, which further comprises:
   first and second intrinsic n-channel FETs having sources connected to said first and second input terminals respectively and gates supplied with the power supply; and
   first and second p-channel FETs having drains connected to said first and second intrinsic n-channel FETs respectively, gates supplied as inputs with the chip enable inverted signal, and sources supplied with the power supply.

8. A semiconductor memory device as claimed in claim 5, which further comprises:
- first and second p-channel FETs having drains connected to said first and second input terminals respectively and gates and drains connected to each other respectively; and
- first and second p-channel FETs having drains connected to said first and second p-channel FETs, gates supplied as inputs with the chip enable inverted signal, and sources both supplied with the power supply.

9. A semiconductor memory device as claimed in claim 5, which further comprises:
- a first bias circuit inserted between the first input terminal of said differential amplifier means and said bit line, said first bias circuit biasing the potential of said bit line so that said potential assumes either of predetermined values; and
- a second bias circuit inserted between said second input terminal of said differential amplifier means and said dummy line, said second bias circuit biasing the potential of said dummy line so that said potential assumes either of predetermined values.

10. A semiconductor memory device as claimed in claim 6, which further comprises:
- a first bias circuit inserted between the first input temrinal of said differential amplifier means and said bit line, said first bias circuit biasing the potential of said bit line so that said potential assumes either of predetermined values; and
- a second bias circuit inserted between said second input terminal of said differential amplifier means and said dummy line, said second bias circuit biasing the potential to said dummy line so that said potential assumes either of predetermined values.

11. In a semiconductor memory device having memory cells storing information therein, a bit line connected to said memory cells, a differential amplifier means having a first input terminal at which the potential of said bit line is fed as an input, a second input terminal at which a reference potential is fed as in input, and an output terminal independent of said first and second input terminals, the differential amplifier means comparing potentials fed at the first and second input terminals with each other and detecting information stored in each of the memory cells, a method of reducing chip enable access time comprising the steps of:
- discharging said bit line to a predetermined potential level in response to a chip non-enable signal; and
- discharging said refeence potential to substantially the same level as said predetermined potential level in response to said chip non-enable signal.

* * * * *